(12) United States Patent
Oreggia et al.

(10) Patent No.: US 11,942,961 B2
(45) Date of Patent: Mar. 26, 2024

(54) ELECTRONIC CIRCUIT HAVING A DIGITAL TO ANALOG CONVERTER

(71) Applicant: STMicroelectronics S.r.l., Agrate Brianza (IT)

(72) Inventors: Daniele Oreggia, Milan (IT); Marco Cignoli, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 183 days.

(21) Appl. No.: 17/713,033

(22) Filed: Apr. 4, 2022

(65) Prior Publication Data
US 2022/0329252 A1   Oct. 13, 2022

(30) Foreign Application Priority Data

Apr. 13, 2021  (IT) .......................... 102021000009269

(51) Int. Cl.
| | | |
|---|---|---|
| *H03M 1/10* | (2006.01) | |
| *H03M 1/56* | (2006.01) | |
| *H03M 1/66* | (2006.01) | |
| *H03M 1/68* | (2006.01) | |

(52) U.S. Cl.
CPC ........... *H03M 1/1071* (2013.01); *H03M 1/56* (2013.01); *H03M 1/662* (2013.01); *H03M 1/687* (2013.01)

(58) Field of Classification Search
CPC ............ H03M 1/56; H03M 1/66; H03M 1/34; H03M 1/662
See application file for complete search history.

(56) References Cited

U.S. PATENT DOCUMENTS

| | | | | |
|---|---|---|---|---|
| 6,557,131 | B1* | 4/2003 | Arabi | H03M 1/109 714/733 |
| 7,158,070 | B1* | 1/2007 | Yang | H03M 1/1019 341/163 |
| 7,664,621 | B2* | 2/2010 | Liggiero, III | H03M 1/109 702/124 |
| 9,041,572 | B1* | 5/2015 | Atwood | H03M 1/109 714/724 |
| 2001/0013770 | A1* | 8/2001 | Wohlfarth | G01R 31/2851 324/73.1 |
| 2009/0039920 | A1* | 2/2009 | Liggiero, III | G01R 23/20 327/2 |

(Continued)

FOREIGN PATENT DOCUMENTS

JP   63299411 A   12/1988

*Primary Examiner* — Lam T Mai
(74) *Attorney, Agent, or Firm* — Seed IP Law Group LLP

(57) ABSTRACT

An electronic circuit includes first and second channels which respectively receive first and second analog signals. The first channel includes a first digital to analog converter having an output coupled to a first input of a first sign comparator, and the second channel includes a second digital to analog converter. A switch network selectively couples, upon reception of a self-test mode signal signaling a test phase, an output of the second digital to analog converter to a second input of the first sign comparator. A ramp generation circuit supplies to the first digital to analog converter and the second digital to analog converter two identical ramps of digital codes, which are shifted by a programmable offset with respect to one another. A checking circuit issues a test status signal based on the output of the first sign comparator.

20 Claims, 5 Drawing Sheets

(56) References Cited

U.S. PATENT DOCUMENTS

| | | | |
|---|---|---|---|
| 2009/0043522 A1* | 2/2009 | Liggiero, III | H03M 1/109 |
| | | | 702/71 |
| 2009/0128382 A1 | 5/2009 | Matsukawa et al. | |
| 2009/0206864 A1* | 8/2009 | Gurevitch | H03M 1/109 |
| | | | 324/750.3 |
| 2010/0164762 A1* | 7/2010 | Datta | H03M 1/1095 |
| | | | 341/118 |

* cited by examiner

ELECTRONIC CIRCUIT HAVING A DIGITAL TO ANALOG CONVERTER

BACKGROUND

Technical Field

Embodiments of the present disclosure relate to solutions for the testing of digital to analog conversion circuits.

Description of the Related Art

The growing complexity of actual smart power devices determines an increase in circuit test time.

Smart power devices always implement A/D conversion structures, which require a focused attention during DFT (Design For Testing) activities in order to meet safety requirements, since they are composed of different blocks which should be singularly testable to guarantee the integrity.

The blocks check, in case of self-test missing, it is usually performed with a long routine in the test program, where all possible stimuli (or a subset of them) are set via communication protocol and output is checked via pin remap. This procedure usually requires a very long test time, which impacts on global device costs.

The solution here described refers to the testing of DAC (Digital to Analog Converters) coupled at their output to a sign comparator.

It is known to apply via communication protocol (e.g., SPI) all digital codes to the DAC input and check output via a pin remap.

By considering that:
the duration of each communication, $T_{COMM}$, requires typically few µs (max 10 µs), depending on the frequency of communication;
IC code changes require a settling time, $T_{SETTL}$, typically of 1 µs;
the duration of each ATE (Automated Test Equipment) reading, $T_{READ}$, requires typically 1 ms;
a common DAC has usually N=10 bits;
the total test time of the known solution for the DAC can be calculated with this formula:

$$T_{TEST_{DAC}} = 2^{N*}(T_{COMM}+T_{SETTL}+T_{READ}) = 1024*(1.011 \text{ ms}) \approx 1.035 \text{ s}$$

The actual DAC check requires a very long test time, as reported in the previous equation, and the possibility to measure externally the output.

BRIEF SUMMARY

On the basis of the foregoing description, the need is felt for solutions which overcome one or more of the previously outlined drawbacks.

According to one or more embodiments, such an object is achieved through an electronic circuit as described herein. Embodiments moreover are directed to a corresponding related method as well as a related computer program product, loadable in the memory of at least one computer and including software code portions for performing the steps of the method when the product is run on a computer. As used herein, reference to such a computer program product is intended to be equivalent to reference to a computer-readable medium containing instructions for controlling a computer system to coordinate the performance of the method. Reference to "at least one computer" is evidently intended to highlight the possibility for the present disclosure to be implemented in a distributed/modular fashion.

As mentioned in the foregoing, the present disclosure provides solutions regarding an electronic circuit comprising a first channel comprising a first digital to analog converter coupled to a respective first sign comparator receiving at its other input a first analog electric quantity, wherein
said electronic circuit comprises:
a second channel comprising at least a second digital to analog converter receiving at its other input a second analog quantity,
a switch network configured to selectively couple, upon reception of a self-test mode signal signaling a test phase, at least the output of the second digital to analog converter at the input of the first sign comparator, the other input of the first sign comparator being maintained coupled to the output of the first digital to analog converter,
a ramp generation circuit configured to send to the input of said first digital to analog converter and second digital to analog converter two identical ramps of digital codes, which are shifted of a programmable offset value one with respect to the other,
a checking circuit coupled at least to the output of said first sign comparator configured to evaluate at least said first sign comparator output and to issue a test status signal, in particular a go/nogo signal, on the basis of values assumed by at least said first sign comparator output.

In variant embodiments, said second digital to analog converter in said second channel is coupled to a second sign comparator, and said switch network is configured to selectively couple, upon reception of a self-test mode signal signaling a test phase, also the output of the first digital to analog converter at an input of said second sign comparator, the other input of the second sign comparator being maintained coupled to the output of the second digital to analog converter,
said checking circuit being coupled to the outputs of the sign comparators and configured to evaluate the sign comparator outputs and to issue a test status signal, in particular a go/nogo signal, on the basis of the values assumed by said outputs of the sign comparators.

In variant embodiments, said switch network comprises:
a first switch selectively coupling said other input of the first sign comparator to said first analog quantity or to the output of said second digital to analog converter under the control of a mode selection signal,
a second switch selectively coupling said other input of the second sign comparator to said second analog quantity or to the output of said first digital to analog converter under the control of said mode selection signal.

In variant embodiments, each ramp comprises a rising ramp and a falling ramp, in particular the ramp generator being configured to apply the programmable offset to the rising ramp applied to one of the digital to analog converters and to the falling ramp applied to the other digital to analog converter.

In variant embodiments, includes one or more circuits in particular delay flip flops, to sample the output or outputs of the comparator maintaining for a programmed delay PD the output or outputs of said comparator, in particular to take in account the time required by the channel under test to react to the applied test input.

In variant embodiments, said checking circuit receives information on the relative position of said ramps in time and it is configured to check if the comparator output or outputs correspond to an expected value given said relative position of said ramps In variant embodiments, said checking circuit RP, ORP) checks if the comparator outputs are opposite.

In variant embodiments, said channels are comprised in an analog to digital conversion circuit.

The solution here described refers also to a method for testing a circuit comprising a first channel comprising a first digital to analog converter coupled to a respective first sign comparator receiving at its other input a first analog electric quantity, comprising providing:
- a second channel comprising second digital to analog converter coupled to a respective second sign comparator receiving at its other input a second analog quantity,
- selectively coupling by a switch network upon reception of a self-test mode signal signaling a test phase, at least the outputs of the first and second digital to analog converter at the inputs of the first sign comparator,
- generating and sending to the input of said first DAC and second DAC two identical ramps of digital codes, which are shifted of a programmable offset value one with respect to the other,
- evaluating at least said first sign comparator output and to issue a test status signal, in particular a go/nogo signal, on the basis of values assumed by at least said first sign comparator output.

In variant embodiments, said selectively coupling includes coupling the output of the first DAC at the input of the second sign comparator, the other input of the second sign comparator being maintained coupled to the second DAC, and the output of the second DAC to the input of the first comparator, the other input of the first sign comparator being maintained coupled to the second DAC,
said evaluating includes evaluating the sign comparator outputs and issuing a test status signal, in particular a go/nogo signal, on the basis of the values assumed by the outputs of the sign comparators.

In variant embodiments, said selectively coupling includes a first switch selectively coupling said other input of the first sign comparator to said first analog quantity or to the output of said second digital to analog converter under the control of a mode selection signal,
a second switch selectively coupling said other input of the second sign comparator to said second analog quantity or to the output of said first digital to analog converter under the control of said mode selection signal.

In variant embodiments, each ramp comprises a rising ramp and a falling ramp, in particular the ramp generator being configured to apply the programmable offset to the rising ramp applied to one of the digital to analog converters and to the falling ramp applied to the other digital to analog converter.

In variant embodiments, a programmed delay is introduced in the sampling the output or outputs of the comparator maintaining for a programmed delay the output or outputs of said comparator, in particular to take in account the time required by the channel under test to react to the applied test input.

In variant embodiments, said evaluating includes receiving information on the relative position of said ramps in time and checking if the comparator output or outputs correspond to an expected value given said relative position of said ramps.

In variant embodiments, said evaluating includes checking if the comparator outputs are opposite.

The solution here described refers also to a computer-program product that can be loaded into the memory of at least one processor and comprises portions of software code for implementing the method according to the previous embodiments.

BRIEF DESCRIPTION OF THE SEVERAL VIEWS OF THE DRAWINGS

Embodiments of the present disclosure will now be described with reference to the annexed drawings, which are provided purely by way of non-limiting example and in which.

DETAILED DESCRIPTION

Figure 1:
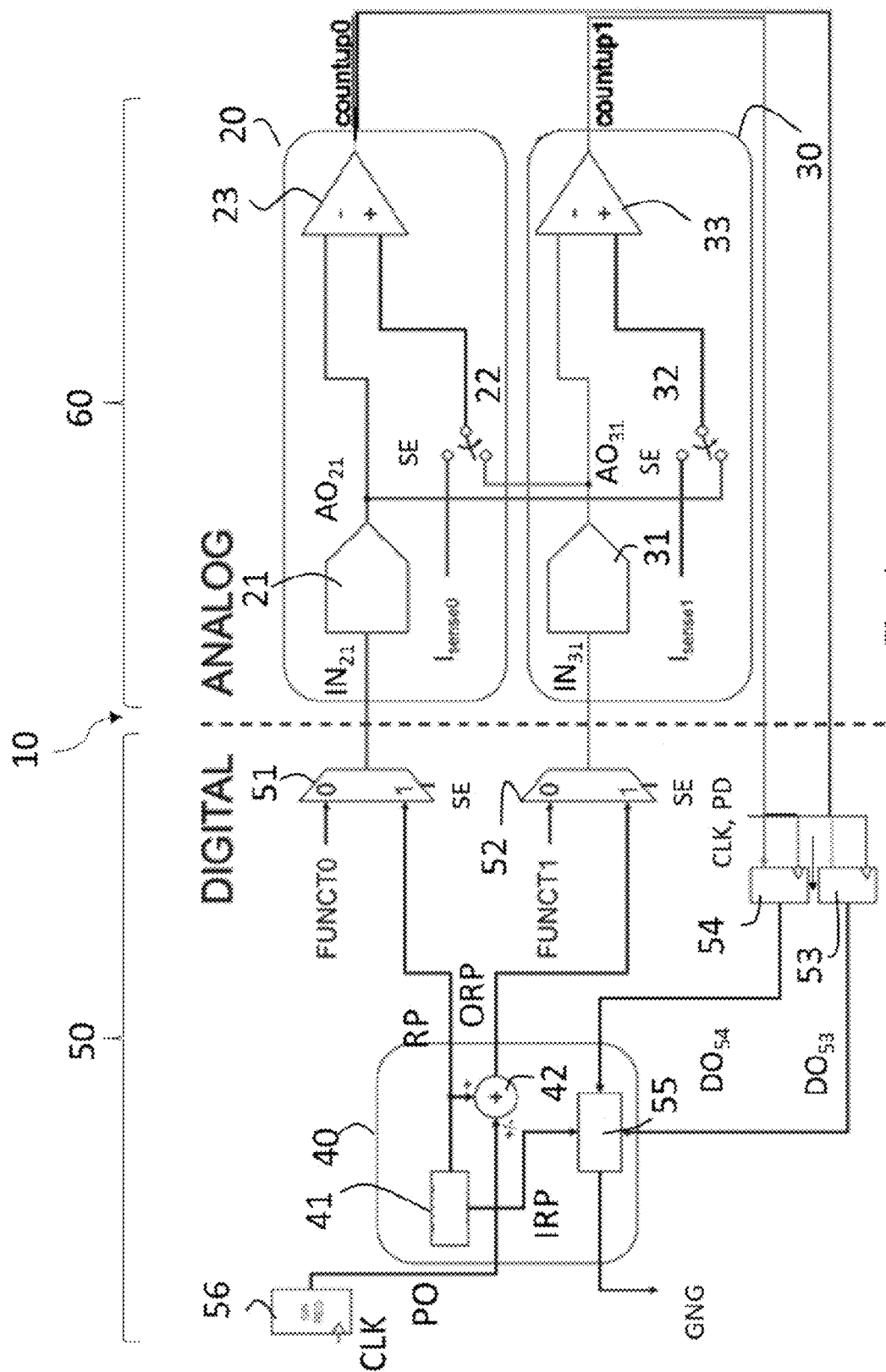
FIG. 1 show a circuit schematic of an embodiment of the electronic circuit here described.

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figures parts, elements or components which have already been described with reference to previous Figures are denoted by the same references previously used in such Figures; the description of such previously described elements will not be repeated in the following in order not to overburden the present detailed description.

The present solution refers to an electronic circuit which includes at least a digital to analog converter coupled to a sign comparator and to a method for testing such an electronic circuit.

In brief, the solution here described includes coupling two equal structures, or channels, including each a digital to analog converter coupled to a sign comparator through a switch network, so that when in self-test mode, the output of the DAC of one structure is coupled to an input of the sign comparator of the other structure, the other input of the sign comparator still being maintained coupled to its respective DAC in the structure. Thus, each of the sign comparator is performing a comparison of the two DAC outputs. A ramp generating circuit is provided which feeds to the two DACs two digital code ramps, in particular each ramp comprising a rising ramp to the DAC full scale value and a falling ramp. One of the ramps is shifted in value of a programmable offset and delayed of a programmable delay, which cover all the input codes of the DAC, i.e., they arrive to the DAC full scale value. A circuit is provided at the output of the sign comparators configured to evaluate the sign comparator outputs and to issue a go/no go signal, on the basis of the values assumed by the sign comparator, in particular a change of sign of the outputs for a time interval within the ramp duration interval.

In this way, an automatic DAC integrity check is performed for all possible digital codes, thus providing the possibility of converting a semi-manual check performed at ATE, in which during the device testing all possible digital codes are set via communication protocol and outputs are checked via pin remap, in a complete automatic self-test GO-NOGO runnable both at an ATE and during run-time.

In FIG. 1 it is shown an electronic circuit 10 comprising a digital portion 50 and an analog portion 60.

In the analog portion 60 it is provided a first channel 20, which includes a first digital to analog converter, or DAC, 21, which output is fed to the inverting input of a first sign comparator 23, i.e., an analog comparator which compares the analog quantities at its two inputs and outputs a high level or low level depending on which quantity is greater. In the example, output countup0 is of the high level if the value of the signal at the negative input is greater than the value of the signal at the positive input. It may be embodied by a differential amplifier, as shown in FIG. 1.

A second channel 30 includes a second DAC 31 which output is fed to the inverting input of a second sign comparator 33.

Each of the first and second channel 20, 30 includes a respective switch 22, 32 commanded by a self-test signal SE, which is for example a logic signal. In the example, if the self-test signal SE is logic zero, this signals operation in normal mode of the first and second channel 20, 30, while if the self-test signal SE is logic one, it signals a self-test mode, in which the channels 20, 30 are tested for possible faults. As it will be also explained in the following, in the embodiment here shown both the channels 20 and 30 in self-test mode are DUT, Devices Under Test.

Thus, in a first position the switch 22 or 32 couples a respective sense current $I_{sense0}$ or $I_{sense1}$ with the other input of the respective sign comparator 23 or 33. In FIG. 1 it is not shown in detail, but the comparator 23, 33 there represented is preferably embodied by a voltage comparator, thus corresponding voltages may be obtained from the sense current $I_{sense0}$ or $I_{sense1}$, e.g., coupling resistors (not shown in FIG. 1) at the corresponding input to obtain a voltage drop at the comparator input. Alternatively the comparator 23, 33 may be a current comparator comparing directly currents coming from the DACs and sense currents $I_{sense0}$, $I_{sense1}$.

In a second position the first switch 22 couples the output of the second DAC 31 with the other input of the first sign comparator 23, the second switch 32 couples the output of the second DAC 31 with the other input of the first sign comparator 23.

Figure 2:
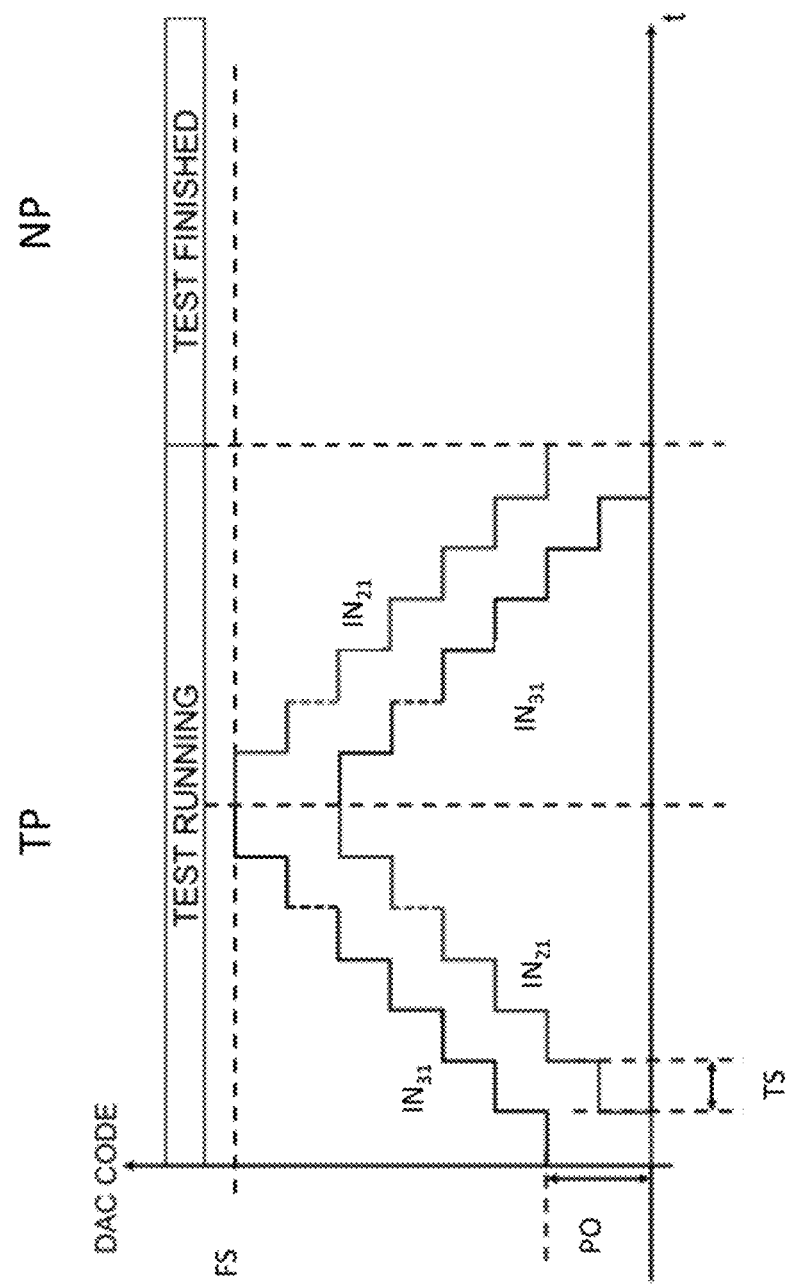
FIG. 2 shows a time diagram of quantities generated as input of the electronic circuit here described.

The digital portion 50 includes a self-test circuit 40, comprising a ramp generator 41, which is configured to output a ramp RP of digital codes, as shown in FIG. 2, i.e., a sequence of increasing digitally coded values. The self-test circuit 40 includes a summation block 42, as well.

The self-test circuit 40 receives from a register 56, in particular a SPI interface register, which is clocked by a clock signal CK, a programmed offset PO value, without sign, which is summed or subtracted in the sum block 42 to or from the codes of the ramp RP, to obtain an offset ramp ORP.

The outputs of the self-test circuit 40, i.e., ramps RP and ORP, are fed to two two-inputs multiplexers 51 and 52, which respective outputs are coupled to the inputs of the first DAC 21 and the second DAC 32 respectively.

The other input of the multiplexers 51 and 52 receives a respective digital signal FUNCT0, FUNCT1 which represents in the example here shown the threshold value for the analog to digital arrangement embodied by channels 20, 30 during normal operation.

The channel 20 or 30 during normal operation, e.g., SE=0, has the switch 22, 32 coupled to the sense current $I_{sense0}$, $I_{sense1}$, which is in this way supplied to the non-inverting input of the comparator 22, 32, i.e., an operational amplifier, and the DAC 21, 31 provides a digitally programmable threshold, FUNCT0, FUNCT1 at the inverting input. The comparator 22, 32 then produces a logic-high output whenever the sense current $I_{sense0}$, $I_{sense1}$ is more positive than its threshold. As also discussed in the following, the channel 20, 30 can be used also in a different way, depending on the signals which are brought as input to the DAC and to the sign comparator of a channel in normal mode. The present solution is not specifically directed to the analog to digital conversion via such channels, but rather to the test of the channels themselves, which in variant embodiments can be comprised also in different circuits.

As for the DAC input selection, the multiplexers 51 and 52 receive as selection signal selecting one of their inputs, the self-test signal SE.

The circuits of the digital portion 50 just described control the inputs of the channels 20, 30, while their outputs, the output signals countup0 and countup1 of the sign comparators 23 and 33, are brought to two respective delay flip-flop circuits 53, 54, which outputs are fed to an output check logic block 55. Also the ramp RP, or information IRP on the ramp RP, as better discussed in the following, is fed to the output check logic block 55.

The two delay flip-flop circuits 53, 54 receive at their clock input a clock signal CLK and programmed delay signal PD. Flip-flop circuits 53, 54 in particular sample the signals countup0 and countup1 of the comparators 23, 33 maintaining for a programmed delay PD the output or outputs of said comparators 23, 33, in particular to take in account the time required by the channel under test to react to the applied test input. The output check logic block 55 on the basis of the value of the digital output signals $DO_{53}$ and $DO_{54}$ of the flip-flop circuits 53, 54 issues a test status signal GNG, specifically a GO/NOGO signal, i.e., a signal with two values, one indicating that the test detects no faults in the channel 20, 30 operation and it is possible then to GO, and the other that a fault is detected, thus the status is NOGO.

Thus, recapitulating, when the self-test signal SE assumes a first logic value, e.g., 0, associated to the normal operation, the switches 22, 32 couple the sense current $I_{sense0}$, $I_{sense1}$ to the positive input of the sign comparator 23, 33, while the multiplexers 51, 52 select the programmed threshold FUNCT0, FUNCT1, as the respective inputs of the DAC 21, 31. This is a normal operation configuration.

The circuit 10 assumes a self-test configuration when the self-test signal SE, under the control of a control circuit, for instance a microprocessor or DSP here not shown, takes a second logic value, e.g., 1, associated to the self-test operation. In this case the first switch 22 couples the output of the second DAC 31, which is indicated with $AO_{31}$ in FIG. 2, with the other input of the first sign comparator 23, the second switch 32 couples the output of the second DAC 21, $AO_{21}$, with the other input of the first sign comparator 23. In the same time the first multiplexer 51 couples the input of the first channel 20 with the ramp generator 41 output, i.e., the ramp RP is fed to the first DAC arrangement 20, while the second multiplexer 52 couples the input of the second channel with the output of the summation block 42, i.e., the offset ramp ORP is fed to the second channel 30.

In this self-test configuration the second DAC 31 output $AO_{31}$ is mapped on the first sign comparator 23 in order to compare it with the first DAC 21 output $AO_{21}$; instead, on the second channel the inputs of the second sign comparator 33 are switched with respect to the inputs of the first comparator 23. By applying on two DACs two different ramps, one shifted by a programmed offset value in comparison with the other one, i.e., RP and ORP, the expected two sign comparators 23, 33 outputs countup0 and countup2 at a given time should be always have values which are opposite and coherent with the ramps, i.e., in accordance with the relative positions of the code values of the ramps at such given time, i.e., coherent with which ramp has the current value greater than the value of the other ramp.

In FIG. 2 it is shown a time diagram representing as a function of time t the codes at the input of DAC 21, 31, determined by ramps RP, ORP, i.e., inputs $IN_{21}$, $IN_{31}$, during the test phase TP. With NP is indicated when the test phase is finished.

The ramps RP and ORP have both a rising ramp portion, in which the code values increase, and a falling ramp in which the code values decrease.

As it can be seen from FIG. 2, the ramp with offset ORP, which corresponds to input $IN_{31}$, in the rising portion of the ramp, is offset by a programmed offset value PO, added by the summation block 42 and coming from the SPI register 56 under the control of a clock CK. In FIG. 2 it is shown also that each step of the ramps, i.e., each code value, is maintained a for a given time step, TS, which in the example is 5 clock cycles Tclk, i.e., time step TS represents the time between each increase of one LSB (Least Significant Bit. The programmed delay PD is set preferably to a value equal to the given time step TS, e.g., 5 clock cycles Tclk. Such programmed delay PD, as mentioned, is applied at the flip-flop circuits 53, 54 where the sign comparators 23, 33 output is sampled, so that are checked in the output check logic block 55 with a delay that can be regulated to take in account the time required by the tested structure to react to the applied stimuli. This is order to align in time and value digital outputs $DO_{53}$ and $DO_{54}$ when they are checked in the output check logic block 55. The check operation at output check logic block 55 takes place in the same instant at the end of every ramp step (after delay PD). For each step after the analog part 60 is introduced a delay PD to provide stable outputs and the digital block 55 evaluates them before to move to the next codes.

By way of example, offset PO can be 10 and delay PD 5.

Offset PO=10 means DAC code shifted up/down (according to ramp phase) by 10 of one of DACs. Programmed delay PD may be considered as clock cycles Tck, therefore PD=5 means 5*Tck.

When the offset ramp ORP in the rising ramp reaches the value corresponding to the upper limit of the scale or range, full-scale FS value, of the DAC converter 31, a decreasing or falling ramp is generated by the ramp generator 41, in particular the ramp generator being configured to apply the programmable offset PO and programmable delay PD to the rising ramp applied to one of the DACs and to the falling ramp applied to the other DAC. This may be obtained simply by having the DAC which was shifted up during the rising ramp shifted down during the falling ramp and vice versa.

To the first DAC 21 is supplied a code sequence corresponding to the ramp RP which, in case of rising ramp goes from zero to full-scale FS minus the programmed offset PO value, and in the falling ramp goes from the full-scale FS to the programmed offset PO value, while for the second DAC 31, which receives the sequence of codes of the ramp with offset ORP, in the rising ramp portion there is an additional offset PO, thus its code values correspond to the ramp RP values plus offset PO, in the falling ramp offset is subtracted, it is ramp RP values minus offset PO. For this reason, in FIG. 1 it is shown the summation block 42 as operating only the ramp supplied to DAC 31, since for the DAC 21 the ramp RP for both the falling and rising ramp starts from one of the ends of the DAC scale, 0 on rising and full-scale FS on falling ramp.

This allows to invert the comparators outputs during the two phases.

If as in the example, PO=10, TS,PD=5, and the number N of bits of the DAC is 4, as shown in FIG. 2, from the initial time the offset ramp ORP increases starting from the initial time, and the ramp RP follows after a programmed delay PD, i.e., 5 clock cycles. The ramp ORP with offset may reach the full-scale value FS of the DAC at time $2^{Nbit}-1*TS$, in the example 75 clock cycles. The full-scale value may be 25 counts, so ramp RP value is 15 and ramp with offset ORP value is 25 Then after expiration of delay PD, which is 5, i.e., at a time of 80 clock cycles, ramp RP value is set to 25 and ramp with offset ORP value is 15, and the falling ramps are started.

Figure 3:
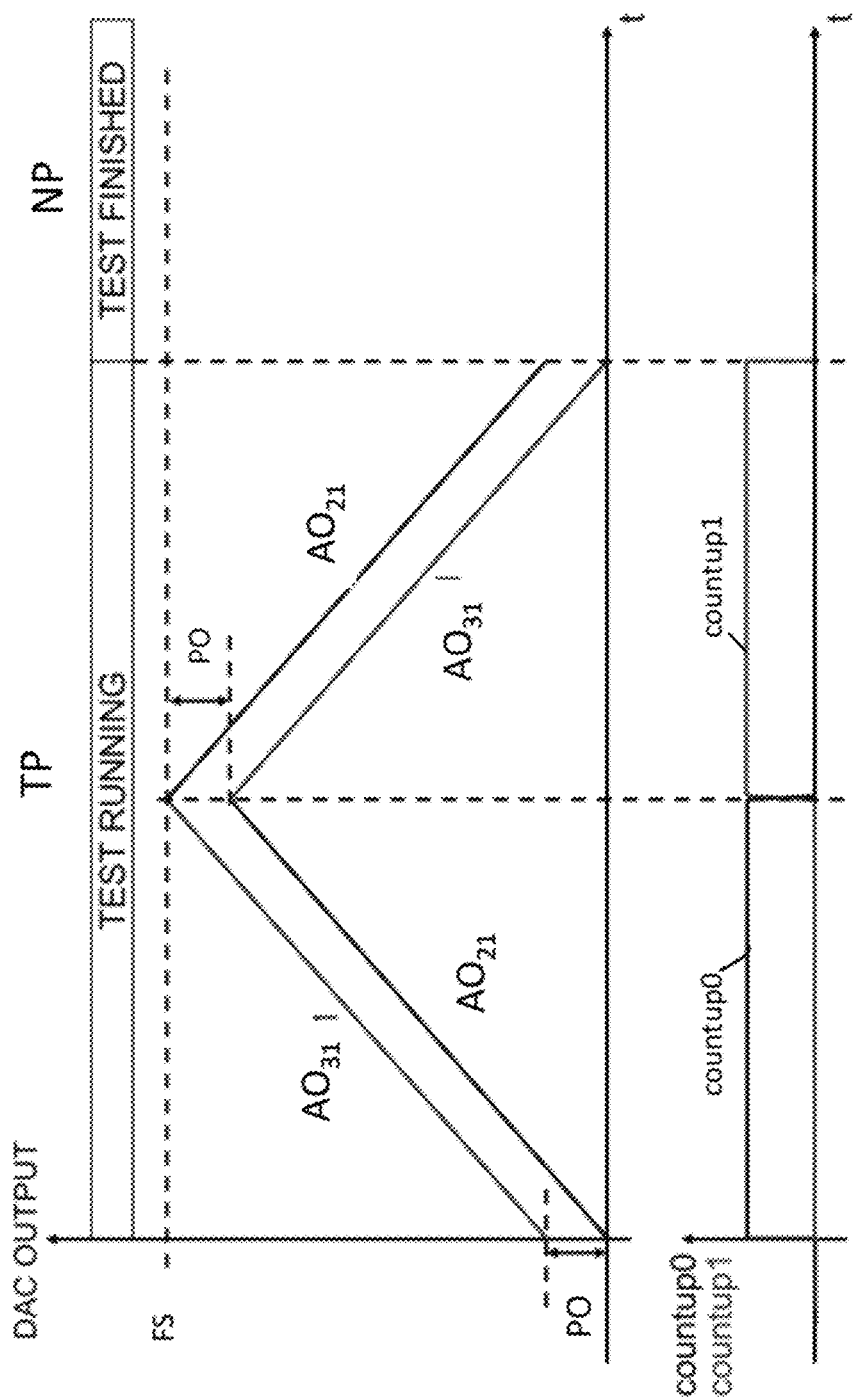
FIG. 3 shows a time diagram of output of the electronic circuit here described in a first operation condition.

In FIG. 3 it is shown a diagram of the analog outputs $AO_{21}$, $AO_{31}$ of the DAC 21 and 31 during the test phase TP and of the outputs countup0, countup1 of the sign comparators 23, 33, in a condition where there is no fault. As it can be seen, the analog signals $AO_{21}$, $AO_{31}$ increase both linearly with the same angular coefficient, displaced of offset PO, and swap their relative position, i.e., the offset PO is applied on the other DAC, e.g., 31, and thus manifests on its corresponding other output, after the reaching of the full-scale value FS.

Figure 4:
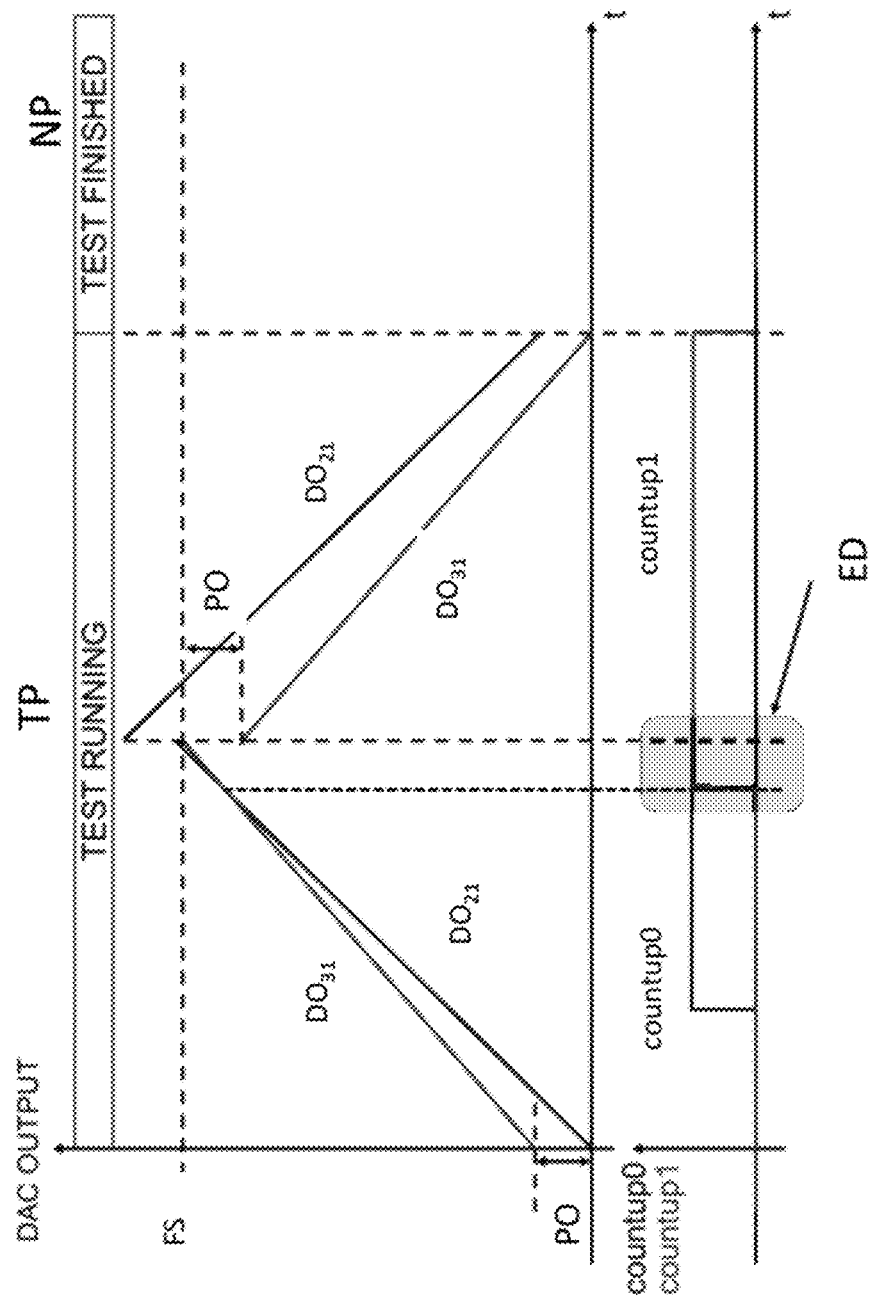
FIG. 4 shows a time diagram of output of the electronic circuit here described in a second operation condition.

In FIG. 4 it is shown a diagram of the outputs $AO_{21}$, $AO_{31}$ of the DAC 21 and 31 during the test phase TP and of the outputs countup0, countup1 of the sign comparators 23, 33, in a condition where there is a gain error on the first DAC 21. The slope of the linear increase for the first DAC 21 is greater than the slope of the linear increase for the second DAC 22, to which the offset PO is applied. When the linear increase of the value of the output $AO_{21}$ of the first DAC 21 surpasses the one $AO_{31}$ of the second DAC 31, the outputs countup0, countup1 of the sign comparators 23, 33 swap value, i.e., one passes from high to low and the other from low to high. Since this occurs before reaching the maximum, i.e., the DAC full scale FS, thus an error ED can be detected at the output check logic block 55. The outputs countup0, countup1 are opposite, but the swap of their logic values is not coherent with the swap of the positions of the ramps RP, ORP or outputs $AO_{21}$, $AO_{31}$ when changing from rising to falling ramp, in particular the swap of outputs countup0, countup1 happens before.

Thus, the output check logic block 55, which receives the ramp RP or information IRP on the ramp parameters sufficient to establish which of the inputs $IN_{21}$, $IN_{31}$ has greater code value at a given time, issues a status signal GNG which indicates an error, i.e., NOGO status, compares the outputs $DO_{53}$, $DO_{54}$ of the flip flops 53, 54 with the information IRP on the ramp parameters, i.e., checks if such outputs $DO_{53}$, $DO_{54}$ correspond to an expected logic value given the relative position of said ramps and/or the time of the change of slope, from rising to falling, with associated swap of the vertical ramp position, indicated by the information IRP or by the received ramp RP itself. More in general, the output check logic block 55 checks if the comparators 23, 33, as sampled by flip-flops 53, 54, provide the opposite values as output or opposite and/or coherent with the ramp relative position. If this is not verified, a fault is present on one of two channels 20, 30 and a flag is set, status signal GNG.

The output check logic block 55, by way of example, may be configured to perform a logic exclusive OR (XOR) between the outputs of the comparators 23, 33, more specifically outputs $DO_{53}$, $DO_{54}$, with delay PD, to verify if they are opposite, but this may not be sufficient. The comparators 23, 33 could provide outputs which are opposite in logic value, but not coherent with the position of the respectively applied ramps. For instance in the example shown in FIG. 2 the output $DO_{53}$ of flip flop 53 has to be low and the output $DO_{54}$ of the flip flop 54 high during the time instants belonging to the rising ramp. Also comparators 23, 33 may undergo output stuck-at fault or an excessive required time to stabilize the DAC plus comparator chain could cause signals $DO_{53}$, $DO_{54}$ at output of flip flops 53, 54 to be equal.

Thus, the output check logic block 55 checks if the outputs of flip flops 53, 54 with the applied delay PD are opposite in logic value and also if the logic value taken is coherent with the application of the offset to the ramps, e.g., the output of the comparator 23 corresponding to the not offset ramp RP has to be low and the other high. Of course, this coherence evaluation may take in account possible logic circuits which have the effect of inverting the outputs flip flops 53, 54, in that case output check logic block 55 checks that output 53 is high and output 54 is low.

Thus in general the output check logic block 55 to check coherence receives information on the relative position of said ramps RP, ORP in time. This information can be represented by the ramp RP or both the ramps RP, ORP themselves, or by parameters of the ramps which enable to evaluate such relative position in time, such as the full-scale value FS of the range of the code sequence, the offset PO and the time step TS value to calculate the time instant of changing from rising ramp to falling ramp, where the relative position is swapped and/or the time instant of changing itself and/or any set of parameters which can be used to represent ramps like ramps RP, ORP. The output check logic block 55 is then configured to check if the comparator outputs correspond to, i.e., are coherent with, an expected value given said relative position of said ramps, for instance, as already mentioned, sampled outputs $DO_{53}$ low and $DO_{54}$ high during the rising ramp. As also mentioned, the expected value can depend on the specific circuitry, e.g., if the comparator output or input is inverted in some point or not, the output check logic block 55, which is general a logic circuit or processing circuit, which can be also a portion of another logic or processing circuit, can be configured to set if the expected value for a given relative position of the ramp is high or low logic value.

Figure 5:
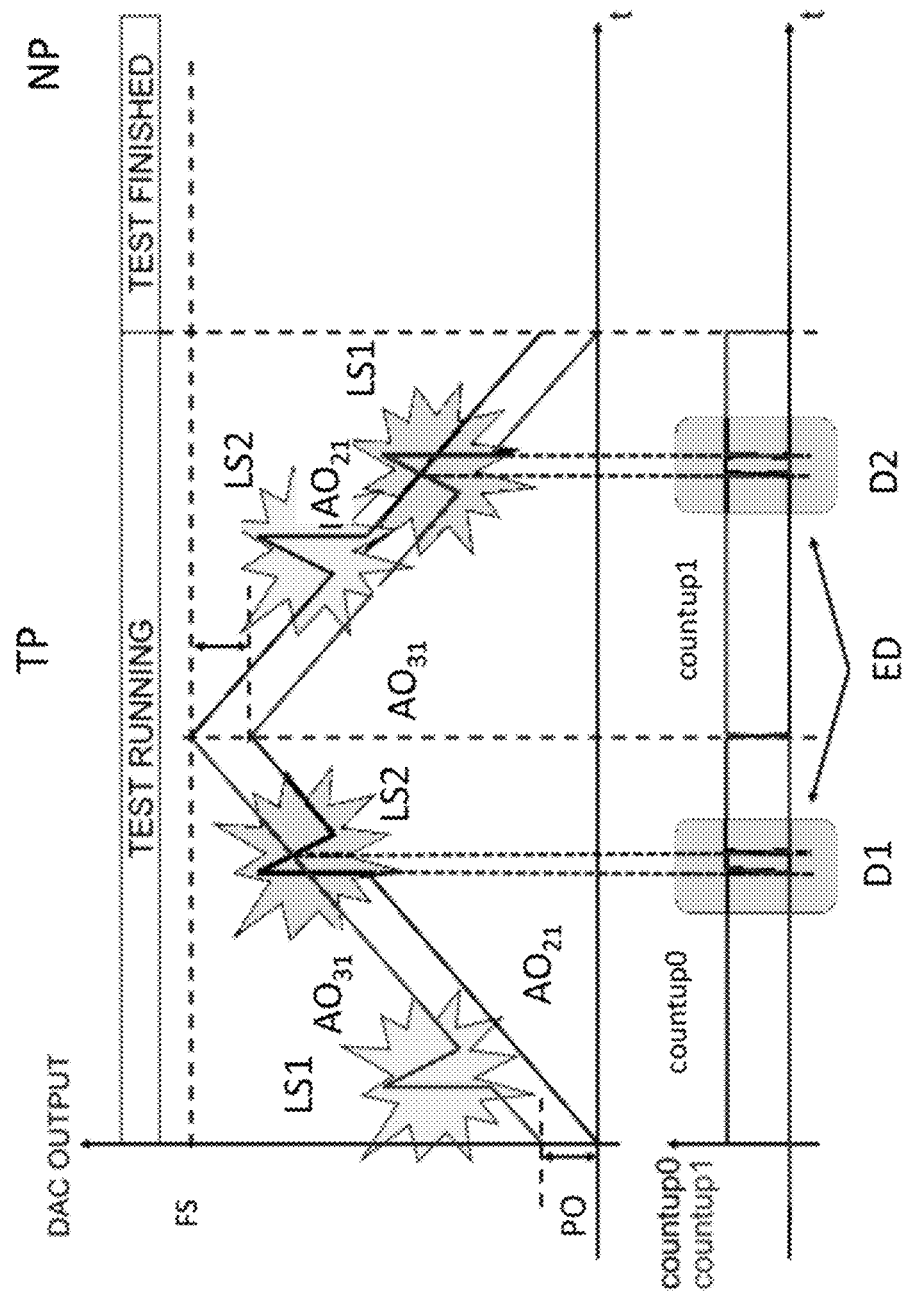
FIG. 5 shows a time diagram of output of the electronic circuit here described in a third operation condition.

In FIG. 5 it is shown a diagram of the outputs $AO_{21}$, $AO_{31}$ of the DAC 21 and 31 during the test phase TP and of the outputs countup0, countup1, of the sign comparators 23, 33, in a condition where there is a local shift on both DAC 21, 31.

As shown a first local shift LS1 takes place on the output $AO_{31}$, i.e., a spike of increase of such analog output, however since the output $AO_{31}$ is determined by the offset ramp ORP (signal $IN_{31}$) at input at the second DAC 31 in the rising ramp portion, output $AO_{31}$ has all values above output $AO_{21}$ at the time instants of the rising ramp, thus no swap takes place in the outputs of the sign comparators 23, 33.

When a second local shift LS2 takes place on the output $AO_{31}$, since the output $AO_{21}$ is determined by the ramp RP (signal $IN_{21}$) at input at the first DAC 21 in the rising ramp portion, a swap of the outputs countup0, countup1 of the sign comparators 23, 33 takes place, for a duration which is equal to the time length of the local shift LS2, then the outputs countup0, countup1 revert back to the previous value. As the length of the local shift LS2 is in general smaller of the total time to perform a rising or falling ramp, a feature such a pulse D1 with its time width or a glitch identifies the length of the local shift LS2. The first local shift LS1 is instead detected, as shown, during the falling ramp, where the ramp ORP is assigned to the other DAC, thus the increase due to the local shift LS1 can determine a swap (pulse D2).

It is here underlined that in FIG. 1 is exemplified an electronic circuit 10 comprising a digital to analog converter coupled to a respective sign comparator and receiving at its other input an analog electric quantity, in normal mode, i.e., the self-test signal SE is not asserted. Circuit 10 can operate as analog to digital converter, but the electronic circuit 10 is just exemplary of circuits which may include a digital to analog converter coupled to a respective sign comparator also for other purposes. The specific signal at the DAC 21, 21 input and at the positive input of the sign comparator 23, 33 can be different according to the application, and so can be different the output of the comparators in normal mode.

The solution here is directed to an electronic circuit 10 which in general comprises a first digital to analog converter, e.g., 21, coupled to a respective first sign comparator. 23, receiving at its other input a first analog electric quantity, sense current $I_{sense0}$.

Then, in order to perform the self-test such electronic circuit further comprises a second channel 30 comprising at least a second digital to analog converter 31 receiving at its other input a second analog quantity, sense current $I_{sense1}$, the second digital to analog converter 31 in said second channel being coupled to a second sign comparator 33, a switch network 22, 32 configured to selectively couple, upon reception of a self-test mode signal SE signaling a test phase TP, the output $AO_{21}$, $AO_{31}$ of the second digital to analog converter 21, 31 at the input of the first sign comparator 33, 23, the other input of the first sign comparator 23 being maintained coupled to the output $AO_{21}$ of the first digital to analog converter 21, and also the output $AO_{21}$ of the first digital to analog converter 21 at an input of said second sign comparator (33), the other input of the second sign comparator (33) being maintained coupled to the output ($AO_{31}$) second digital to analog converter (31). Thus, the switch network also decouples from the analog electric quantity, sense current $I_{sense0}$ or $I_{sense1}$, by the input of the corresponding comparator.

The circuit further comprises a ramp generation circuit 41 configured to send to the input of said first DAC 21 and second DAC 31 two identical ramps RP, ORP of digital codes, which are shifted of a programmable offset value PO one with respect to the other a checking circuit 55, the output check logic block, coupled to the outputs $DO_{53}$, $DO_{54}$ of the sign comparators, in particular through the sampling performed at flip flops 55 with the programmed delay PD; configured to evaluate the sign comparator outputs and to issue a test status signal, which is for instance a flag signaling if there is error or not, in particular a go/nogo signal indicating the result of a pass/fail test, on the basis of the values assumed by the sign comparators, in particular a change of sign of the outputs for a time interval within the ramp duration interval and/or a coherence check. It will be appreciated that in variant embodiments the circuit 55 may check only the opposite values or the coherence.

Now, by way of example, a calculation of the test time $T_{SELFTEST_{DAC}}$ necessary or suitable to test a DAC by the solution here described is discussed.

By considering by way of example the following values:
the shift between two ramps, offset PO, may be set to 10, as mentioned this being DAC codes;
the time required to have stable result each step, programmed delay PD, could be 4, e.g., 4 clock cycles Tclk;
a duration of each communication, $T_{COMM}$, requires typically few μs (max 10 μs), depending on the frequency of communication;
IC code changes requires a settling time, $T_{SETTL}$, typically of 1 μs;
a common DAC has usually N=10 bits;
clock cycle $T_{CLK}$ is usually equal to 62.5 ns ($f_{CLK}$=16 MHz);
the total test time $T_{SELFTEST_{DAC}}$ of the solution here described can be calculated with this formula:

$$T_{SELFTEST_{DAC}} = [2 \cdot (T_{SETTL} + T_{READ})]^* + [2 \cdot (2^N - PO) \cdot PD \cdot T_{CLK}] = 22 \text{ μs} + 507 \text{ μs} \approx 529 \text{ μs}$$

which is four magnitude orders lower than the test time of the prior art solution.

In variant embodiments, the solution could be also implemented for a single comparator by exploiting a second DAC (no cross check with two comparators). More in detail in case only one comparator is present, i.e., the second comparator, e.g., 33, is missing because a second DAC 31 without sign comparator is exploited, the first DAC 21 output is remapped on comparator 33 in order to compare it with second DAC 31 output. In this case the check is focused only on the single comparator output, which should respect that the comparator output takes logic values corresponding to the relative positions of the ramps (i.e., upper position, ramp with offset PO lower position down ramp without offset PO).

A sampling flip flop such as flip-flop 53 or 54 may also be present, which may also introduce a programmed delay, in order to supply the correct timing to the analogic portion 60.

In this case the checking circuit 55 may be used to evaluate only the coherence of the single comparator output, i.e., to check if the comparator output corresponds to an expected value given the relative position of the ramps RP, ORP.

Thus, more in general the solution here described is directed to an electronic circuit comprising a first channel 20 comprising a first digital to analog converter (21) coupled to a respective first sign comparator 23 receiving at its other input a first analog electric quantity, such as sense current $I_{sense0}$, wherein said electronic circuit comprises
a second channel 30 comprising at least a second digital to analog converter 31 receiving at its other input a second analog quantity, $I_{sense1}$, a switch network 22, 32 configured to selectively couple, upon reception of a self-test mode signal SE signaling a test phase TP, at least the output $AO_{21}$, $AO_{31}$ of the second digital to analog converter 21, 31 at the input of the first sign comparator 33, 23, the other input of the first sign comparator 23 being maintained coupled to the output $AO_{21}$ of the first digital to analog converter 21, a ramp generation circuit 41 configured to send to the input of said first digital to analog converter 21 and second digital to analog converter 31 two identical ramps RP, ORP of digital codes, which are shifted of a programmable offset value PO one with respect to the other, a checking circuit 55 coupled at least to the output of said first sign comparator 23, 33 configured to evaluate at least said first sign comparator output 23, 33 and to issue a test status signal GNG, in particular a go/nogo signal, on the basis of values assumed by at least said first sign comparator output 23, 33.

The solution just described, thus, by considering a structure, i.e., channel, composed of a DAC and a sign comparator, used in particular for A/D conversion, a self-test can be implemented by exploiting simultaneously two equal structures that test each other.

The self-test covers the DAC integrity along all possible codes with a rising and a falling ramp, and the capability of two comparators to correctly provide 0 and 1.

In case, during the ramps, comparators provide the same outputs or opposite and incoherent with the ramps, a fault is present on one of two DUTs and a flag is set.

The self-test provides the possibility to configure the shift between two applied ramps (in order to consider the DAC uncertainty) and the time delay between digital codes applying and outputs sampling (in order to cover the time required by the tested structure to react to the applied stimuli).

This solution replaces the actual routine for a DAC structure with only a sign comparator in an automatic and quicker self-test, which does not require any external equipment.

The solution here described reduces test time and related costs maintaining test coverage by implementing a self-test.

More in detail, the possibility to convert a semi-manual check (where the stimuli are sent via communication protocol) in a complete automatic self-test GO-NOGO runnable both at ATE and run-time, provides the possibility to reduce test time, related costs and effort for test program. Moreover, it is added the feature to re-run the test also on-field Of course, without prejudice to the principle of the disclosure, the details of construction and the embodiments may vary widely with respect to what has been described and illustrated herein purely by way of example, without thereby departing from the scope of the present disclosure.

An electronic circuit may be summarized as including a first channel (20) including a first digital to analog converter (21) coupled to a respective first sign comparator (23) receiving at its other input a first analog electric quantity ($I_{sense0}$), wherein said electronic circuit including a second channel (30) including at least a second digital to analog converter (31) receiving at its other input a second analog quantity ($I_{sense1}$), a switch network (22, 32) configured to selectively couple, upon reception of a self-test mode signal (SE) signaling a test phase (TP), at least the output ($AO_{21}$, $AO_{31}$) of the second digital to analog converter (21, 31) at the input of the first sign comparator (33, 23), the other input of the first sign comparator (23) being maintained coupled to the output ($AO_{21}$) of the first digital to analog converter (21), a ramp generation circuit (41) configured to send to the input of said first digital to analog converter (21) and second digital to analog converter (31) two identical ramps (RP, ORP) of digital codes, which are shifted of a programmable offset value (PO) one with respect to the other, a checking circuit (55) coupled at least to the output of said first sign comparator (23, 33) configured to evaluate at least said first sign comparator output (23, 33) and to issue a test status signal (GNG), in particular a go/nogo signal, on the basis of values assumed by at least said first sign comparator output (23, 33).

Said second digital to analog converter (31) in said second channel may be coupled to a second sign comparator (33), and said switch network (22, 32) may be configured to selectively couple, upon reception of a self-test mode signal (SE) signaling a test phase (TP), also the output ($AO_{21}$) of the first digital to analog converter (21) at an input of said second sign comparator (33), the other input of the second sign comparator (33) being maintained coupled to the output ($AO_{31}$) of said second digital to analog converter (31), said checking circuit (55) being coupled to the outputs ($DO_{53}$, $DO_{54}$) of the sign comparators (23, 33) and configured to evaluate the sign comparator (23, 33) outputs and to issue a test status signal, in particular a go/nogo signal, on the basis of the values assumed by said outputs ($DO_{53}$, $DO_{54}$) of the sign comparators (23, 33).

Said switch network (22, 32) may include a first switch (22) selectively coupling said other input of the first sign comparator (23) to said first analog quantity or to the output of said second digital to analog converter (31) under the control of a mode selection signal (SE), a second switch (32) selectively coupling said other input of the second sign comparator (33) to said second analog quantity or to the output of said first digital to analog converter (21) under the control of said mode selection signal (SE).

Each ramp (RP, ORP) may include a rising ramp and a falling ramp, in particular the ramp generator being configured to apply the programmable offset (P0) to the rising ramp applied to one of the digital to analog converters and to the falling ramp applied to the other digital to analog converter.

May include one or more circuits (53, 54) in particular delay flip flops, to sample the output or outputs of the comparator (23, 33) maintaining for a programmed delay (PD) the output or outputs of said comparator (23, 33), in particular to take in account the time required by the channel under test to react to the applied test input.

Said checking circuit (55) may receive information on the relative position of said ramps (RP, ORP) in time and it is configured to check if the comparator output or outputs correspond to an expected value given said relative position of said ramps Said checking circuit (55) RP, ORP) may check if the comparator outputs are opposite.

Said channels (20, 30) may be included in an analog to digital conversion circuit.

9. A method for testing a circuit comprising a first channel (20) may be summarized as including a first digital to analog converter (21) coupled to a respective first sign comparator (23) receiving at its other input a first analog electric quantity ($I_{sense0}$), including providing a second channel (30) including second digital to analog converter (31) coupled to a respective second sign comparator (33) receiving at its other input a second analog quantity ($I_{sense1}$), selectively coupling by a switch network (22, 32) upon reception of a self-test mode signal (SE) signaling a test phase (TP), at least the output ($AO_{21}$, $AO_{31}$) of the second digital to analog converter (21, 31) at the input of the first sign comparator (33, 23), the other input of the first sign comparator (23) being maintained coupled to the output ($AO_{21}$) of the first digital to analog converter (21), generating (41) and sending to the input of said first DAC (21) and second DAC (31) two identical ramps (RP, ORP) of digital codes, which are shifted of a programmable offset value (PO) one with respect to the other, evaluating (55) at least said first sign comparator output (23, 33) and to issue a test status signal (GNG), in particular a go/nogo signal, on the basis of values assumed by at least said first sign comparator output (23, 33).

A method may include providing to a second sign comparator (33) coupled to said second digital to analog converter (31) in said second channel, and said selectively coupling, upon reception of a self-test mode signal (SE) signaling a test phase (TP), also the output ($AO_{21}$) of the first digital to analog converter (21) at an input of said second sign comparator (33), the other input of the second sign comparator (33) being maintained coupled to the output ($AO_{31}$) second digital to analog converter (31), said evaluating (55) includes evaluating the sign comparator (23, 33) outputs and to issue a test status signal, in particular a go/nogo signal, on the basis of the values assumed by said outputs ($DO_{53}$, $DO_{54}$) of the sign comparators (23, 33).

Said selectively coupling may include a first switch (22) selectively coupling said other input of the first sign comparator to said first analog quantity or to the output of said second digital to analog converter under the control of a mode selection signal (SE), a second switch (32) selectively coupling said other input of the second sign comparator to said second analog quantity or to the output of said first digital to analog converter under the control of said mode selection signal (SE).

Each ramp (RP, ORP) may include a rising ramp and a falling ramp, in particular the ramp generator being configured to apply the programmable offset (P0) to the rising ramp applied to one of the digital to analog converters and to the falling ramp applied to the other digital to analog converter.

A method may include introducing a programmed delay (PD) in the sampling the output or outputs of the comparator (23, 33) maintaining for a programmed delay (PD) the output or outputs of said comparator (23, 33), in particular to take in account the time required by the channel under test to react to the applied test input.

Said evaluating (55) may include receiving information on the relative position of said ramps (RP, ORP) in time and checking if the comparator output or outputs correspond to an expected value given said relative position of said ramps Said evaluating (55) may include checking if the comparator outputs are opposite.

A computer-program product that can be loaded into the memory of at least one processor and may be summarized as including portions of software code for implementing the method.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic circuit, comprising:
a first channel including a first digital to analog converter having an output coupled to a first input of a first sign comparator, the first channel configured to receive a first analog signal;
a second channel including a second digital to analog converter, the second channel configured to receive a second analog signal;
a switch network configured to selectively couple, upon reception of a self-test mode signal signaling a test phase, an output of the second digital to analog converter to a second input of the first sign comparator, the first input of the first sign comparator being maintained coupled to the output of the first digital to analog converter;
a ramp generation circuit configured to supply to the first digital to analog converter and the second digital to analog converter two identical ramps of digital codes, which are shifted by a programmable offset with respect to one another; and
a checking circuit coupled to an output of the first sign comparator, the checking circuit configured to issue a test status signal based on the output of the first sign comparator.

2. The electronic circuit of claim 1, wherein the second channel includes a second sign comparator, the second digital to analog converter having an output coupled to a first input of the second sign comparator, and the switch network is configured to selectively couple, upon reception of the self-test mode signal signaling a test phase, the output of the first digital to analog converter at a second input of the second sign comparator, the first input of the second sign comparator being maintained coupled to the output of the second digital to analog converter,
the checking circuit being coupled to the output of the first sign comparator and to an output of the second sign comparator, the checking circuit configured to issue the test status signal based on the outputs of the first and second sign comparators.

3. The circuit of claim 2, wherein the switch network includes:
a first switch configured to selectively couple the second input of the first sign comparator to the first analog signal or to the output of the second digital to analog converter based on the self-test mode signal; and
a second switch configured to selectively couple the second input of the second sign comparator to the second analog signal or to the output of the first digital to analog converter based on the self-test mode signal.

4. The circuit of claim 1, wherein each ramp includes a rising ramp and a falling ramp, the ramp generation circuit being configured to apply the programmable offset to the rising ramp applied to one of the first or second digital to analog converters and to the falling ramp applied to the other of the first or second digital to analog converters.

5. The circuit of claim 2, further comprising one or more delay flip flops configured to sample the outputs of the first and second sign comparators and to maintain the outputs of the first and second sign comparators for a programmed delay.

6. The circuit of claim 2, wherein the checking circuit receives information regarding a relative position of the ramps in time and is configured to check if one or both of the first sign comparator output or the second sign comparator output corresponds to an expected value based on the relative position of the ramps.

7. The circuit of claim 2, wherein the checking circuit checks if the outputs of the first and second sign comparators are opposite.

8. The circuit of claim 1, wherein the first and second channels are comprised in an analog to digital conversion circuit.

9. A method for testing a circuit including first and second channels, the first channel including a first digital to analog converter having an output coupled to a first input of a first sign comparator, the first channel configured to receive a first analog signal, the second channel including a second digital to analog converter, the second channel configured to receive a second analog signal, the method comprising:
selectively coupling by a switch network, upon reception of a self-test mode signal signaling a test phase, an output of the second digital to analog converter to a second input of the first sign comparator, the first input of the first sign comparator being maintained coupled to the output of the first digital to analog converter;
generating, by a ramp generation circuit, and sending to inputs of the first digital to analog converter and the second digital to analog converter two identical ramps of digital codes, which are shifted by a programmable offset with respect to the other; and
issuing, by a checking circuit coupled to an output of the first sign comparator, a test status signal based on the output of the first sign comparator.

10. The method of claim 9, wherein the second channel includes a second sign comparator, the second digital to analog converter having an output coupled to a first input of the second sign comparator, the checking circuit being coupled to an output of the second sign comparator, the method further comprising:
selectively coupling by the switch network, upon reception of the self-test mode signal signaling a test phase, the output of the first digital to analog converter at a second input of the second sign comparator, the first input of the second sign comparator being maintained coupled to the output of the second digital to analog converter; and
issuing the test status signal based on the outputs of the first and second sign comparators.

11. The method of claim 10, wherein the switch network includes:
a first switch configured to selectively couple the second input of the first sign comparator to the first analog signal or to the output of the second digital to analog converter based on the self-test mode signal; and
a second switch configured to selectively couple the second input of the second sign comparator to the second analog signal or to the output of the first digital to analog converter based on the self-test mode signal.

12. The method of claim 9, wherein each ramp includes a rising ramp and a falling ramp, the ramp generation circuit being configured to apply the programmable offset to the rising ramp applied to one of the first or second digital to analog converters and to the falling ramp applied to the other of the first or second digital to analog converters.

13. The method of claim 10, further comprising:
sampling the outputs of the first and second sign comparators; and
maintaining the outputs of the first and second sign comparators for a programmed delay.

14. The method of claim 10, further comprising receiving information regarding a relative position of the ramps in time and checking if one or both of the first sign comparator output or the second sign comparator output corresponds to an expected value based on the relative position of the ramps.

15. The method of claim 10, further comprising checking, by the checking circuit, if the outputs of the first and second sign comparators are opposite.

16. A non-transitory computer-readable medium having stored instructions thereon that, when executed by one or more processors, cause the one or more processors to perform a method for testing a circuit including first and second channels, the first channel including a first digital to analog converter having an output coupled to a first input of a first sign comparator, the first channel configured to receive a first analog signal, the second channel including a second digital to analog converter, the second channel configured to receive a second analog signal, the method comprising:

selectively coupling by a switch network, upon reception of a self-test mode signal signaling a test phase, an output of the second digital to analog converter to a second input of the first sign comparator, the first input of the first sign comparator being maintained coupled to the output of the first digital to analog converter;

generating, by a ramp generation circuit, and sending to inputs of the first digital to analog converter and the second digital to analog converter two identical ramps of digital codes, which are shifted by a programmable offset with respect to the other; and issuing, by a checking circuit coupled to an output of the first sign comparator, a test status signal based on the output of the first sign comparator.

17. The non-transitory computer-readable medium of claim 16, wherein the second channel includes a second sign comparator, the second digital to analog converter having an output coupled to a first input of the second sign comparator, the checking circuit being coupled to an output of the second sign comparator, wherein the method further comprises:

selectively coupling by the switch network, upon reception of the self-test mode signal signaling a test phase, the output of the first digital to analog converter at a second input of the second sign comparator, the first input of the second sign comparator being maintained coupled to the output of the second digital to analog converter; and issuing the test status signal based on the outputs of the first and second sign comparators.

18. The non-transitory computer-readable medium of claim 16, wherein the method further comprises:

sampling the outputs of the first and second sign comparators; and maintaining the outputs of the first and second sign comparators for a programmed delay.

19. The non-transitory computer-readable medium of claim 16, wherein the method further comprises:

receiving information regarding a relative position of the ramps in time and checking if one or both of the first sign comparator output or the second sign comparator output corresponds to an expected value based on the relative position of the ramps.

20. The non-transitory computer-readable medium of claim 16, wherein the method further comprises:

checking, by the checking circuit, if the outputs of the first and second sign comparators are opposite.

* * * * *